(12) United States Patent
Theodoras, II et al.

(10) Patent No.: US 6,792,015 B1
(45) Date of Patent: Sep. 14, 2004

(54) THERMO-ELECTRIC COOLER CIRCUIT AND METHOD FOR DWDM/TDM MODE SELECTION

(75) Inventors: James T. Theodoras, II, Plano, TX (US); Matthew L. Heston, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 245 days.

(21) Appl. No.: 09/751,996

(22) Filed: Dec. 29, 2000

(51) Int. Cl.$^7$ ................................................. H01S 3/04
(52) U.S. Cl. ........................................... 372/34; 372/36
(58) Field of Search ............................. 372/33, 34, 36, 372/3, 75, 108, 29.015, 31, 29.021; 350/214 C; 359/123, 136, 328, 124; 62/3.7; 324/721

(56) References Cited

U.S. PATENT DOCUMENTS

| | | | | |
|---|---|---|---|---|
| 4,809,291 A | * | 2/1989 | Byer et al. | 372/75 |
| 5,019,769 A | * | 5/1991 | Levinson | 372/31 |
| 5,088,098 A | * | 2/1992 | Muller et al. | 372/34 |
| 5,185,736 A | * | 2/1993 | Tyrrell et al. | 359/136 |
| 5,303,250 A | * | 4/1994 | Masuda et al. | 359/328 |
| 5,521,375 A | * | 5/1996 | Jang | 250/214 C |
| 5,604,758 A | * | 2/1997 | AuYeung et al. | 372/34 |
| 5,754,574 A | * | 5/1998 | Lofthouse-Zeis et al. | 372/34 |
| 5,943,352 A | * | 8/1999 | Fee | 372/108 |
| 5,966,394 A | * | 10/1999 | Spurr et al. | 372/34 |
| 6,014,237 A | * | 1/2000 | Abeles et al. | 359/124 |
| 6,094,918 A | * | 8/2000 | Burbidge et al. | 62/3.7 |
| 6,101,200 A | * | 8/2000 | Burbidge et al. | 372/29.021 |
| 6,519,949 B1 | * | 2/2003 | Wernlund et al. | 62/3.7 |
| 6,525,550 B2 | * | 2/2003 | Pan | 327/721 |
| 2003/0033819 A1 | * | 2/2003 | Prescott | 62/3.7 |

* cited by examiner

*Primary Examiner*—Don Wong
*Assistant Examiner*—Tuan N. Nguyen
(74) *Attorney, Agent, or Firm*—Campbell Stephenson Ascolese LLP

(57) ABSTRACT

An optical transceiver and method therefore provides a cooled laser diode configured to run in either a low power mode or a standard mode. A method for a thermo-electric cooler includes coupling the thermo-electric cooler to a laser diode, operating the thermo-electric cooler in one of a low power mode and a standard mode, and switching between the low power mode and the standard mode. The laser diode is configured to transmit signals in the low power mode and the standard mode. The low power mode maintains the laser diode at a temperature within a predetermined range of temperatures. The standard mode maintains the laser diode at a temperature that corresponds to a predetermined wavelength of light output from the laser diode. In one embodiment, the low power mode is a Time Division Multiplexing (TDM) mode and the standard mode is a Dense Wavelength Divison Multipexing (DWDM) mode. The optical transceiver includes a temperature circuit, a thermo-electric cooler coupled to the temperature circuit, and a laser diode coupled to the thermo-electric cooler. The thermo-electric cooler is responsive to inputs from the temperature circuit, the inputs identifying one of at least a first mode and a second mode, wherein a choice of mode is a function of a performance requirement. The optical transceiver includes a temperature circuit that includes a switch configured to alter the thermo-electric cooler between the first mode and the second mode.

22 Claims, 5 Drawing Sheets

THERMO-ELECTRIC COOLER CIRCUIT AND METHOD FOR DWDM/TDM MODE SELECTION

BACKGROUND OF THE INVENTION

1. Field of the Invention

The present invention relates to the field of laser diodes, and more particularly, to thermo-electric cooling circuitry for laser diodes.

2. Description of the Related Art

A data communications network is the interconnection of two or more communicating entities (i.e., data sources and/or sinks) over one or more data links. A data communications network allows communication between multiple communicating entities over one or more data communications links. High bandwidth applications supported by these networks include streaming video, streaming audio, and large aggregations of voice traffic. In the future, these demands are certain to increase. To meet such demands, an increasingly popular alternative is the use of lightwave communications carried over fiber optic cables. The use of lightwave communications provides several benefits, including high bandwidth, ease of installation, and capacity for future growth.

The synchronous optical network (SONET) protocol is among those protocols designed to employ an optical infrastructure and is widely employed in voice and data communications networks. SONET is a physical transmission vehicle capable of transmission speeds in the multi-gigabit range, and is defined by a set of electrical as well as optical standards. A similar standard to SONET is the Synchronous Digital Hierarchy (SDH) which is the optical fiber standard predominantly used in Europe. There are only minor differences between the two standards. Accordingly, hereinafter any reference to the term SONET refers to both SDH and SONET networks, unless otherwise noted.

Lightwave communication requires lasers. There are several types of laser diode configurations used in lightwave communications, including cooled and uncooled laser diodes. Cooled lasers provide better performance, however, cooled lasers further require a thermo-electric cooler (TEC). Uncooled lasers do not require a TEC, but generally perform less efficiently. Cooled laser diodes are typically used for Wavelength Division Multiplexing (WDM) and Dense Wavelength Division Muliplexing (DWDM) applications which increase data throughput of fiberoptic systems. WDM and DWDM example data is shown in Table 1, below. The bandwidths shown are exemplary only and depend on the signal carried. Note that the tighter the spacing the less bandwidth will be available for use.

TABLE 1

| Spacing (GHz) | Spacing (nm) | Channels | Bandwidth (nm) |
| --- | --- | --- | --- |
| 400 | 3.2 | 8 | 0.8 |
| 200 | 1.6 | 16 | 0.5 |
| 100 | 0.8 | 32 | 0.2 |
| 50 | 0.4 | 64 | 0.1 |

DWDM systems are typically referred to as those WDM systems for which the channel count is 32 and above. Table 1 shows the spacing of representative channels in frequency units and wavelength units. As shown, the denser spacing allows many more channels. The table also shows that WDM and DWDM systems have narrow bandwidths. The laser diodes used by WDM and DWDM systems are tunable to access the appropriate portions of a communication spectrun. More particularly, the laser diodes used for DWDM applications must be tunable for wavelength channel spacings of as small as 0.8 and 0.4 nanometers as shown in Table 1. The wavelength of the laser diodes are typically tuned by changing the temperature of the laser diodes. Accordingly, systems employing laser diodes for DWDM applications closely monitor the temperature of laser diodes used in DWDM applications to prevent channel interference and crossover noise.

In contrast with DWDM applications, Time Division Multiplexing (TDM) applications do not require close monitoring of laser diodes because the modulation is in the time domain. More specifically, the concerns of channel interference are not an issue for TDM applications because in TDM a particular time slot is assigned to each signal source, and the complete signal is constructed from portions of the signal collected from each time slot, all on the same channel.

Typically, cooled systems for lasers using TEC circuitry can dissipate as much as 10 Watts of energy. Those in the art have attempted to improve the power/performance ratio for typical laser diode systems by attempting to improve the performance of uncooled lasers and by increasing the efficiency of TEC circuitry for cooled lasers with little success. Accordingly, when high performance is required in applications such as lightwave conmmunications, cooled lasers are typically used. Conversely, when lower performance is acceptable for lightwave conmmunications, uncooled lasers are typically used.

What is needed, therefore, is a system and circuitry for improving the power/performance ratio for both cooled and uncooled laser diodes for both high and low performance applications.

SUMMARY OF THE INVENTION

In accordance with the present invention, a thermo-electric cooler circuitry and a method therefore provides a cooled laser diode configured to run in either a low power mode or a standard mode. A method for a thermo-electric cooler includes coupling the thermo-electric cooler to a laser diode, operating the thermo-electric cooler in one of a low power mode and a standard mode, the laser diode configured to transmit signals in the low power mode and the standard mode, and switching between the low power mode and the standard mode. The low power mode maintains the laser diode at a temperature within a predetermined range of temperatures. The standard mode maintains the laser diode at a temperature that corresponds to a predetermined wavelength of light output from the laser diode. In general, the wavelength of light output corresponds proportionately to a change in temperature from 0.1 nanometers per degree Centigrade. In one embodiment, the low power mode is a Time Division Multiplexing (TDM) mode and the standard mode is a Dense Wavelength Divison Multipexing (DWDM) mode.

In one embodiment, the predetermined range of temperatures is a range of temperatures within which the laser diode has a user-defined power versus performance ratio and the predetermined range of temperatures are input by one of a user and a system generated source. In another embodiment, the predetermined range of temperatures is determined by a user setting a temperature measure above and below a fixed temperature that corresponds to a wavelength of light output from the laser diode. The temperature measure is either a delta about a fixed temperature or a minimum temperature and a maximum temperature set above and below the fixed temperature.

Another method in accordance with an embodiment relates to a method for providing thermo-electric cooled system. The method includes providing a first mode and a second mode of operating a laser diode wherein the choice of mode is a function of a power and performance requirement. The function, in one embodiment, is a ratio of power versus performance wherein the power required to cool a laser diode is compared with the performance required for one of a plurality of laser diode applications.

Another embodiment of the invention is directed to an optical transceiver including a temperature circuit, a thermo-electric cooler coupled to the temperature circuit, and a laser diode coupled to the thermo-electric cooler. The thermo-electric cooler is responsive to inputs from the temperature circuit, the inputs identifying one of at least a first mode and a second mode, wherein a choice of mode is a function of a performance requirement. In an embodiment, the optical transceiver includes a temperature circuit that includes a switch configured to alter the thermo-electric cooler between the first mode and the second mode.

In an embodiment, the optical transceiver further includes a coupler coupled to the laser diode, the coupler producing an optical signal, an optical fiber coupled to the coupler, and a wavelength signal circuit coupled to the lens and the temperature circuit, the wavelength signal circuit configured to transmit feedback to the temperature circuit to maintain a stable wavelength of the laser diode. In one embodiment the optical transceiver is disposed on an OC-transceiver line card of a synchronous optical network (SONET) communication system.

In an embodiment, the first mode is a low-power mode and the second mode is a standard mode wherein the first mode is configured to permit a predetermined amount of wavelength drift. The first mode is further allows a thermo-electric cooler to dissipate less than 2 Watts depending on the amount of wavelength drift allowed.

Another embodiment is directed to an optical transceiver that includes a circuit for providing a laser diode circuit with at least a first mode and a second mode, wherein a choice of mode is a function of a performance requirement. The performance requirement is one of a high performance requirement including dense-wavelength-division-multiplexing type applications and a low performance requirement including time-domain-multiplexing type applications. The optical transceiver further includes a switch, the switch configured to alter a thermo-electric cooled circuit between the first mode and the second mode. The first mode is a time-division multiplexed (TDM) mode wherein the laser diode is set to a range of temperatures. More specifically, in an embodiment, the (TDM) mode includes a temperature delta wherein the TEC circuit permits temperature variations within the range of temperatures. In one embodiment, the TDM mode operates with no power under normal operating conditions and operates with less than 2 Watts of power in failure conditions, such as air conditioning failures in central office storage facilities. Further, the TDM mode permits wavelength drift while maintaining the performance requirement.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise indicated.

DETAILED DESCRIPTION OF THE INVENTION

The following is intended to provide a detailed description of an example of the invention and should not be taken to be limiting of the invention itself. Rather, any number of variations may fall within the scope of the invention that is defined in the claims following the description.

Figure 1:
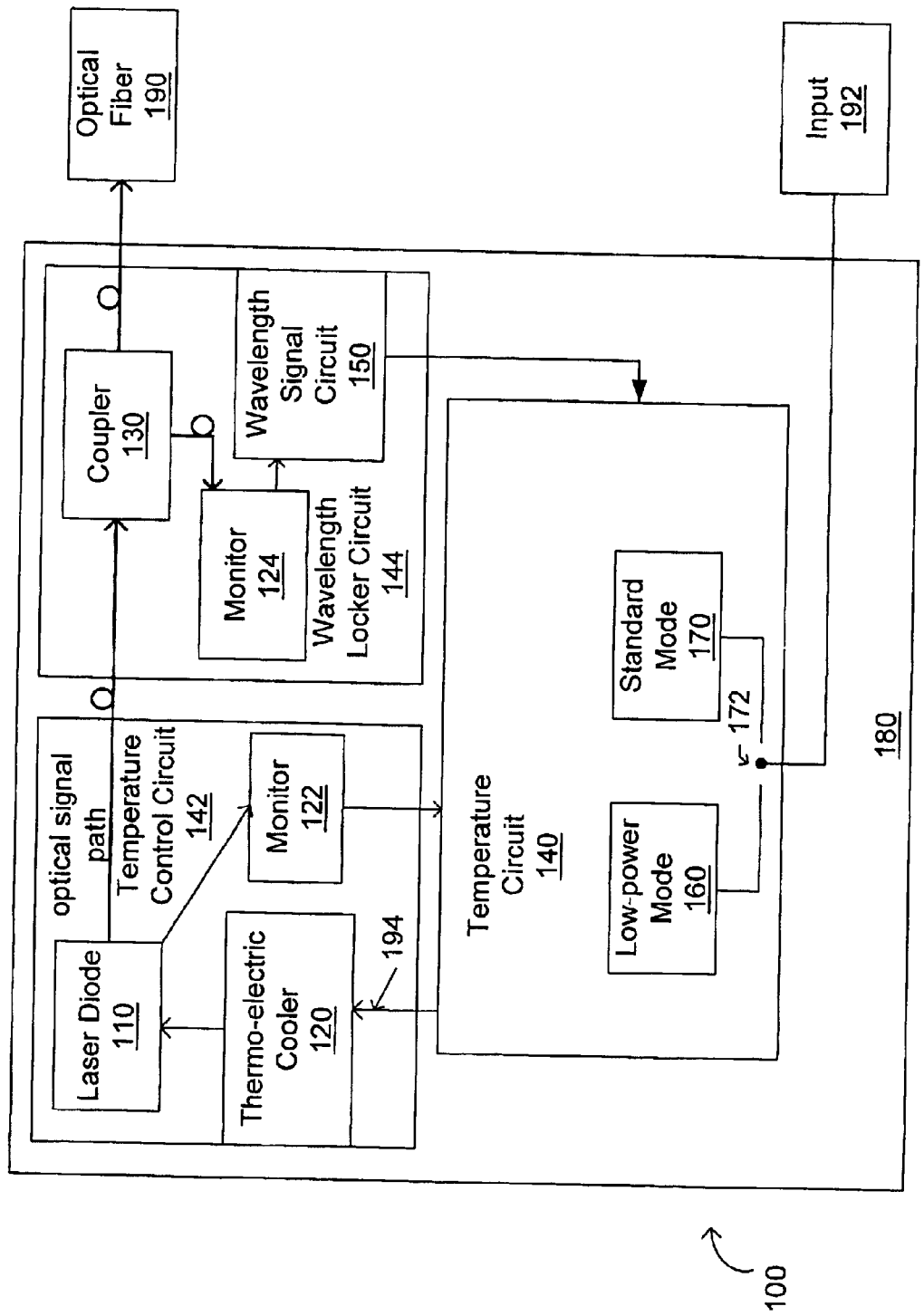
FIG. 1 is a block diagram of a thermo-electric cooler circuit in accordance with an embodiment of the present invention.

Referring now to FIG. 1, a portion 100 of a communication system is shown. FIG. 1 includes an optical transceiver 180 coupled to an input 192, and an output to optical fiber 190. Optical transceiver 180 is appropriate for use in a line card for an optical communication system such as a system using optical signals to convey information over an optical waveguiding medium, for example, an optical fiber in a SONET communication system. Optical transceiver 180 includes a temperature circuit 140, including low-power mode circuitry 160 and standard-mode circuitry 170. Both the low-power mode circuitry 160 and the standard-mode circuitry are coupled to a switch 172. Switch 172 is controlled via an input 192 that directs the temperature circuit 140 to operate one of the low-power mode circuitry 160 and the standard mode circuitry 170. Input 192 is one of a user operated input and a system generated input. In one embodiment, input 192 is used to set the temperature circuit 140. Setting the temperature circuit 140 includes inputting a Twave that represents a fixed temperature that corresponds to a desired wavelength of light output. The Twave temperature is used for both low-power mode and standard mode. In one embodiment the Twave temperature is 25° Centigrade, although one of ordinary skill in the art appreciates that temperatures at which an appropriate wavelength of light output is a function of the laser diode used in the optical transciever 180. Input 192 further accepts a Tmin that represents a minimal ambient temperature at which the laser diode 110 operates in a low power mode without the thermo-electric cooler 120 dissipating power. Tmin is determined with reference to the Twave temperature. Likewise, input 192 accepts a Tmax that represents a maximum ambient temperature at which the laser diode 110 operates in a low power mode without causing the thermo-electric cooler 120 to dissipate power. In one embodiment the difference between Twave and Tmin and the difference between Twave and Tmax are the same. When the differences are the same, input 192 accepts a Tdelta, representing an equidistant measure about Twave wherein the thermo-electric cooler 120 does not dissipate power. In one embodiment, input 192 further accepts minimum and maximum power consumption parameters, such as a Pmax for heating and a Pmax for cooling, as further described below.

Optical transceiver 180 further includes a wavelength locker circuit 144 that provides feedback to the temperature circuit 140 and to the laser diode 110 via the thermo-electric cooler 120. Wavelength locker circuit 144 includes a wavelength signal circuit 150 that provides feedback to the temperature circuit 140 for maintaining the appropriate wavelength output from the laser diode 110 and coupler 130. Wavelength locker circuit 144 further includes monitor 124 that monitors the wavelength and measures the difference between the input desired wavelength and the actual wavelength output from the laser diode 110 and coupler 130.

Optical transceiver 180 further includes a temperature control circuit 142 that operates to provide feedback to the temperature circuit 140 and to the wavelength locker circuit 144. More particularly, temperature control circuit 142 includes thermo-electric cooler 120, laser diode 110 and monitor 122. Monitor 122 monitors the temperature of the laser diode 110 by comparing the desired temperature with the actual temperature of the laser diode 110 and provides feedback to the temperature circuit 140. Temperature circuit 140 receives the feedback from the monitors 122 and 124 and compares the temperature and wavelength readings with the appropriat input parameters, such as Twave, Tmin, Tmax, Tdelta, and Pmax for heating and a Pmax for cooling.

The low-power mode circuitry 160 directs the temperature circuit 140 to operate thermo-electric cooler 120 in a low-power mode when selected. More particularly, low-power mode, in one embodiment, refers to a Time Division Multiplexing (TDM) mode. In TDM mode the temperature circuit 140 is turned off or in a low power mode allowing the thermo-electric cooler 120 temperature to drift thereby allowing the wavelength output from the laser diode 110 to also drift within set parameters. When reaching a setpoint, the thermo-electric cooler 120 will adjust the temperature and wavelength associated therewith to be within the predetermined ranges. Those of skill in the art will appreciate that the wavelength of the optical signal is inversely proportional to the temperature of the laser diode 110 within the a defined operating range.

In another embodiment of the a low-powered mode, the temperature circuit 140 directs the thermo-electric cooler 120 to maintain the laser diode 110 within a predetermined range of temperatures about a given fixed temperature. When the ambient temperatures are outside the range of temperatures, the thermo-electric cooler 120 stops dissipating additional power to compensate for the conditions, such as failure conditions, but maintains the power level. The maintaining the laser diode within the range of temperatures allows a cooled laser to operate in applications that allow some drift in wavelength, such as WDM applications that have looser channel spacings than DWDM applications.

Figure 2:
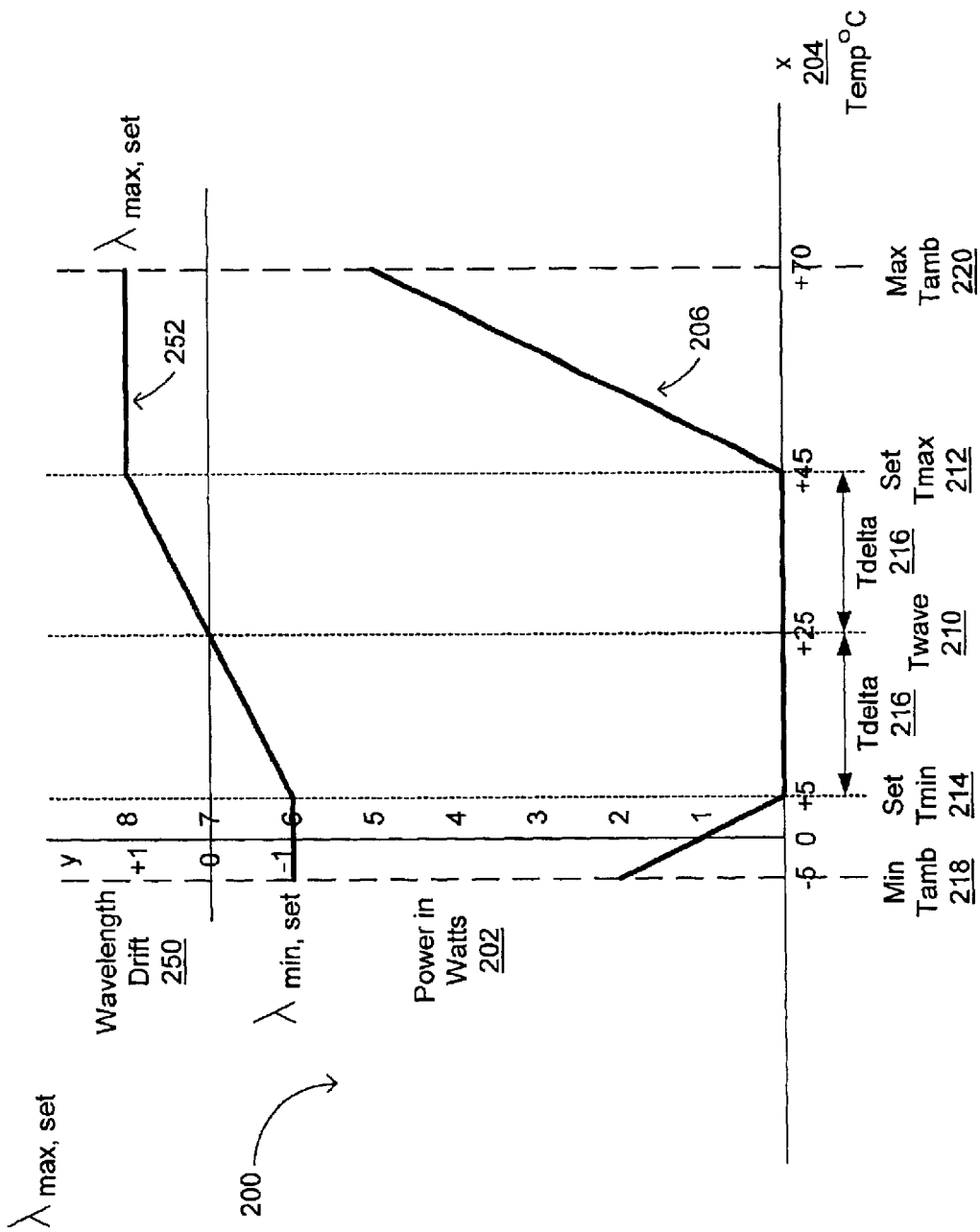
FIG. 2 is a graphical representation of nonlinear cooling of a thermo-electric cooling system in accordance with an embodiment of the present invention.

Referring to FIG. 2, a graphical representation 200 of the TDM mode is shown. More particularly, FIG. 2 shows non-linear graph of the power versus temperature when the thermo-electric cooler 120 is in a TDM mode. The Y axis indicates the Power in Watts 202 required by the thermo-electric cooler 120 when in TDM mode, and the X axis indicates the temperature in Centigrade of the ambient temperature detected by the monitor 122 within the temperature control circuit 142. Thus, line 206 in FIG. 2 indicates the power in Watts required to operate the laser diode in the ambient temperatures shown. More particularly, FIG. 2 shows that within the predetermined range of temperatures, no power is dissipated by the optical transceiver 180. Thus, between 5 and 45° Centigrade, no power is dissipated. Outside of the range of temperatures, the power dissipated by the optical transceiver is linearly correlated to the ambient temperature, as is the case for cooled laser diodes. FIG. 2 further shows the settings Twave 210, Tdelta 216, Set Tmin 214 and Set Tmax 220, and Min Tamb 218 and Max Tamb 222 that are accepted by input 192 shown in FIG. 1. FIG. 2 shows a Twave 210 temperature of 250 Centigrade, a Set Tmax 220 of 450 Centigrade, and a Set Tmin 214 of 5° Centigrade. As described above, Twave 210 represents a fixed temperature that corresponds to a desired wavelength of light output from the laser diode 110. In a low-power mode, such as a TDM mode, a user or a system inputs a range using a Tdelta 216, or a Tmin 214 and a Tmax 220. After inputting the range, the optical transceiver guarantees that the temperature of the laser diode 110 stays bounded within the range input. In one embodiment, a user or system inputs a maximum ambient temperature 222 and a minimum ambient temperature 218. Within the bounds of the minimum Min Tamb 218 and the maximum, Max Tamb, the laser diode 110 is cooled with thermo-electric cooler 120 to maintain operable conditions of the laser diode 110. Thus, line 206 slopes, indicating a power dissipation when the temperature monitor indicates an ambient temperature between the Set Tmax 220 temperature and the Max Tamb 222 temperature, and between the Set Tmin 214 temperature and the Min Tamb 218 temperature. Thus, as shown in FIG. 2, the thermo-electric cooler operates during temperatures of 45° and 70° Centigrade and during temperatures of −5 and 5° Centigrade.

Referring to FIG. 1 and FIG. 2 in combination, in operation, the low-power mode uses less power than in standard mode. Further, when in low-power mode, the laser diode 110 uses less power than when in standard mode, while providing performance advantages of a laser in standard mode. Those of skill in the art appreciate that a laser operating in standard mode is referred to as a "cooled laser." Referring to FIG. 2, assume that Twave of 25° Centigrade 210 is provided and a typical maximum ambient temperature is 70° Centigrade. As shown, when monitor 122 detects temperatures of 5° and 45° Centigrade, no power is dissipated. During an air conditioning failure of a central office holding optical equipment such as an optical transceiver, the ambient temperature may reach temperatures of approximately 70° Centigrade. As shown in FIG. 2, in such failure conditions as an air conditioning failure, the thermo-electric cooler 120 will still dissipate less than half the power required for standard mode. As shown, the power dissipated at 70° Centigrade is approximately 5 Watts. A typical application of a cooled laser requires 10 Watts of power. Also shown in FIG. 2 is line 252 which represents the wavelength drift 250 associated with the temperature in Centigrade. As shown, the wavelength is allowed to drift when the temperatures detected remain within Set Tmin 214 and Set Tmax 212, when the temperature is outside, then the wavelength of the laser diode 110 is allowed to drift.

Figure 3:
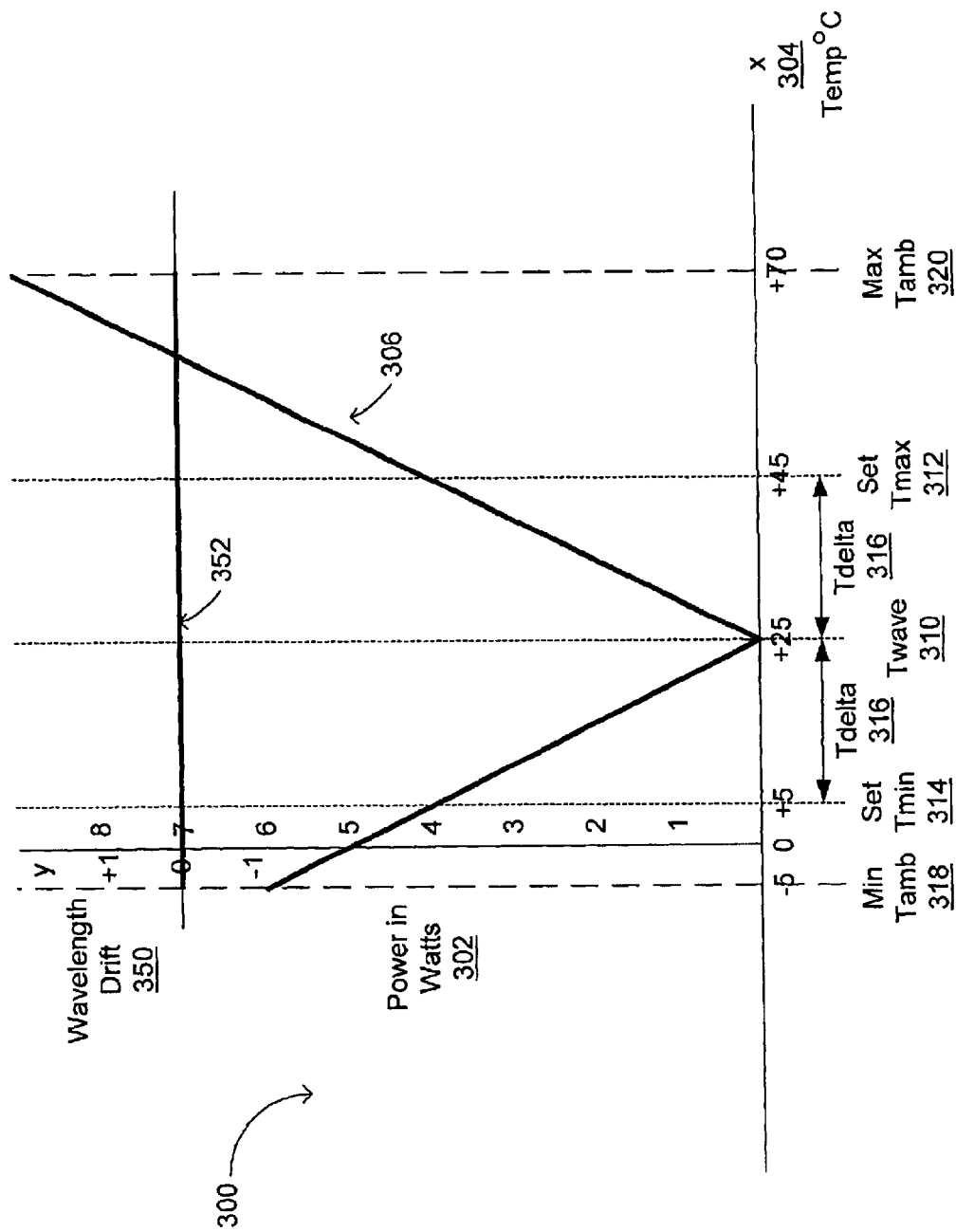
FIG. 3 is a graphical representation showing linear cooling of a thermo-electric cooling system.

Referring to FIG. 3, a graphical representation 300 of the power versus ambient temperature is shown for a standard mode of operating the optical transciever 180 in accordance with an embodiment. The graphical representation shows a line 306 representing the linear cooling required for standard mode applications, such as DWDM. One of skill in the art, however, appreciates that linear cooling may be appropriate for other applications such as Wave Division Multiplexing (WDM) applications.

FIG. 3 includes a Y axis 302 showing the power dissipation in Watts, an X axis 304 showing the temperature of the ambient conditions in degrees Centigrade, and the line 306, showing the transfer function of the optical transceiver. In the standard mode, wavelength stability is maintained and power dissipation increases linearly with the temperature between Twave 310 Set Tmax 312 and Set Tmin 314, unlike the mode shown in FIG. 2. Further, outside the range of temperatures of Set Tmax 312 and Set Tmin 314, the power dissipation further increases with temperature changes until Max Tamb 320 or Min Tamb 318 is reached. Referring to the example provided above for failure conditions of a central office, the transfer function line 306 shows that the thermo-electric cooler 120 dissipates approximately 5 Watts of power during normal ambient conditions and approximately 10 Watts during failure conditions. Further, FIG. 3 shows that the wavelength drift line 352 between the Max Tamb 320 and the Min Tamb 318 is maintained at zero. Note that the power axis is ignored for purposes of the wavelength drift 350.

Figure 4:
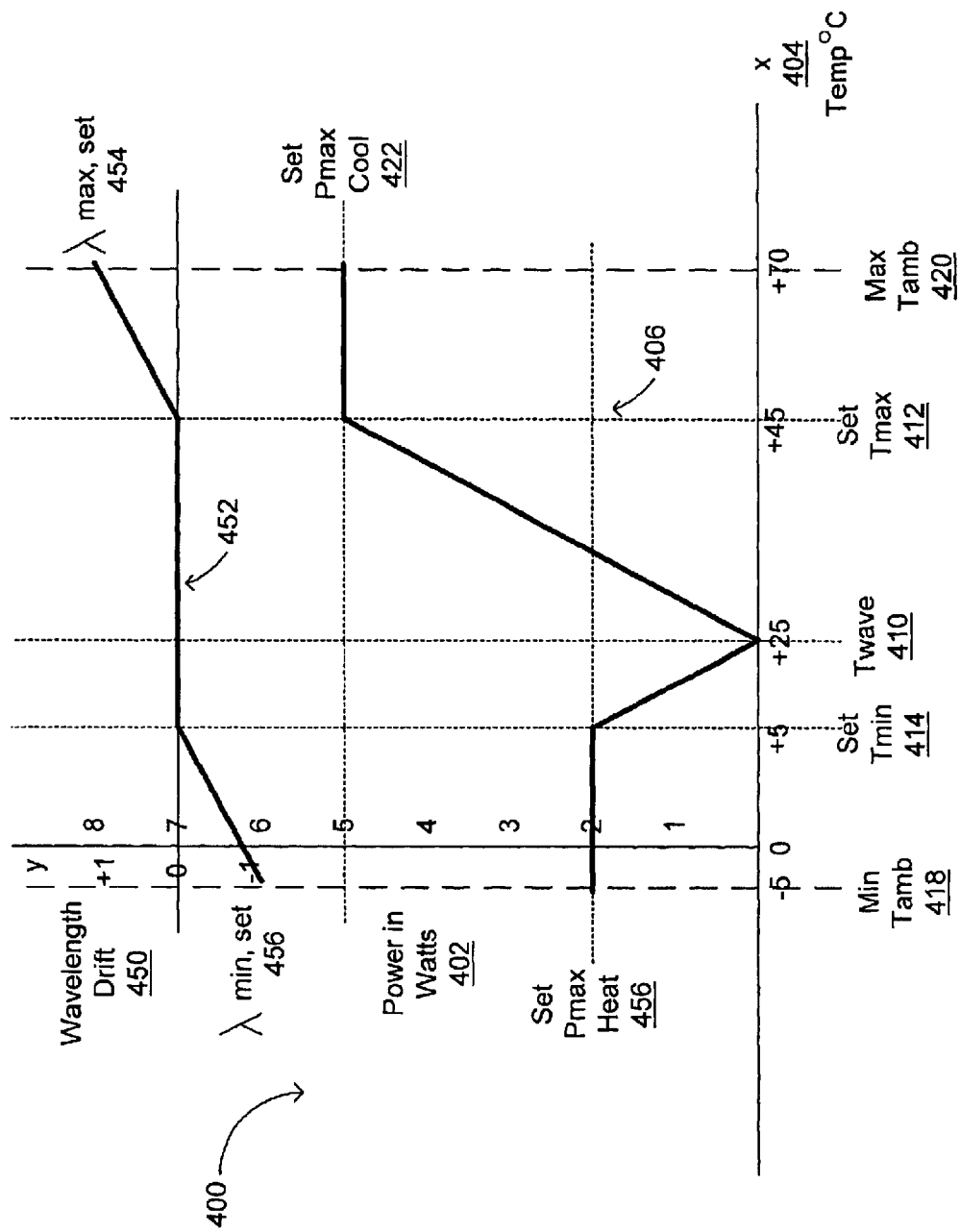
FIG. 4 is a graphical representation of nonlinear cooling of a thermo-electric cooling system in accordance with an alternate embodiment of the present invention.

Referring now to FIG. 4, a graphical representation 400 of the power versus ambient temperature is shown for a quasi-standard mode of operating the optical transciever 180 in accordance with an embodiment. The graphical representation shows a line 406 representing the linear cooling required for quasi-standard mode applications, such as WDM. FIG. 4 includes a Y axis 402 showing the power dissipation in Watts, an X axis 404 showing the temperature of the ambient conditions in degrees Centigrade, the line 406, showing the transfer function of the optical transceiver, and a line 452 showing the wavelength drift 450 for different temperatures. In the quasi-standard mode, wavelength stability is maintained and power dissipation increases linearly with the temperature between 5° Centigrade and 45° Centigrade, Set Tmax 412 and Set Tmin 414. However, unlike the mode shown in FIG. 3, the outside the range of temperatures of Set Tmax 312 and Set Tmin 314, the power dissipation does not further increase with temperature changes until Max Tamb 420 or Min Tamb 418 are reached. Rather, when Set Tmax 312 and Set Tmin 314 are reached, no further power dissipation is permitted. Likewise, when set Pmax heat 456 and Set Pmax cool 422 are reached, no additional power dissipation is permitted. FIG. 4 shows that the wavelength drift line 452 between the Max Tamb 420 and the Min Tamb 418 is maintained at zero. However, unlike FIG. 3, wavelength is allowed to drift outside of the Max Tamb 420 and the Min Tamb 418. Note that the power axis is ignored for purposes of the wavelength drift 350.

Figure 5:
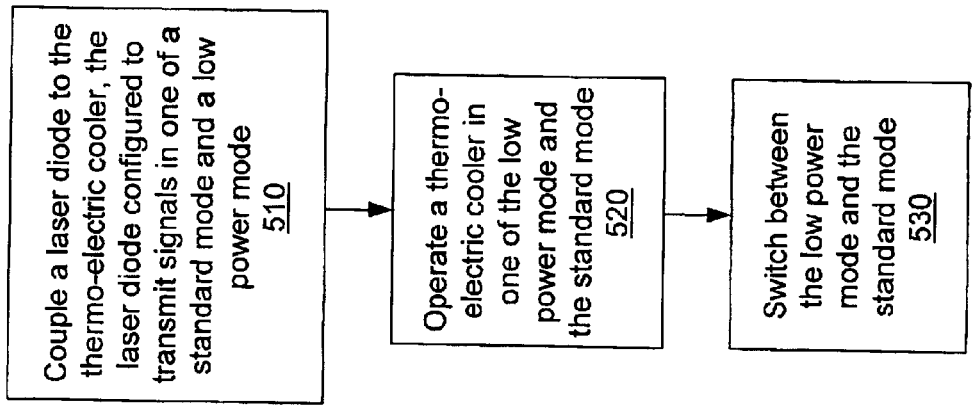
FIG. 5 is a flow diagram showing a method in accordance with an embodiment of the present invention.

Referring now to FIG. 5, a flow diagram illustrates a method in accordance with an embodiment. Block 510 provides for coupling a laser diode to a thermo-electric cooler, the laser diode configured to transmit signals in one of a standard mode and a low power mode. As shown in FIG. 1, laser diode 110 is coupled to thermo-electric cooler 120. Laser diode 110 is a "cooled" diode operable to transmit signals for a plurality of applications including time division multiplexing (TDM), dense wavelength division multiplexing (DWDM) and wavelength division multiplexing (WDM) applications. In one embodiment, the laser diode diode is operable in one of a first mode and, a second mode wherein the choice of mode is a function of a user-defined power and performance ratio. For example, the function in an embodiment is a ratio of power versus performance wherein the power required to cool a laser diode is compared with the performance required for one the laser diode applications.

Block 520 provides for operating a thermo-electric cooler in one of the low power mode and the standard mode. Referring to FIG. 1, operating the thermo-electric cooler 120 in either a low power mode or a standard mode is determined via temperature circuit 140.

Block 530 provides for switching between the low power mode and the standard mode. A user or a system generated signal is input from input 192 that indicates at switch 172 whether thermo-electric cooler 120 is in low power mode or standard mode. The output 194 from temperature circuit 140 provides the indication of the mode in which the thermo-electric cooler 120 is run.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A method for a thermo-electric cooler coupled to a laser diode, the method comprising:

operating the thermo-electric cooler in one of at least a low power mode and a standard mode, the laser diode configured to transmit signals in the low power mode and the standard mode; and switching between the low power mode and the standard mode, wherein:

the low power mode maintains the laser diode at a temperature within a predetermined range of temperatures by operating the thermo-electric cooler according a non-linear transfer function; and the standard mode maintains the laser diode at a temperature that corresponds to a predetermined wavelength of light output from the laser diode by operating the thermo-electric cooler according to a non-linear transfer function.

2. The method of claim 1 wherein the low power mode is a Time Division Multiplexing (TDM) mode.

3. The method of claim 1 wherein the standard mode is a Dense Wavelength Divison Multipexing (DWDM) mode.

4. The method of claim 1 further comprising:

operating the thermo-electric cooler in a quasi-standard mode, the laser diode configured to transmit signals in the quasi-standard power mode.

5. The method of claim 1 wherein laser diode is configured in an OC-192 transceiver line card disposed in a synchronous optical network (SONET) communication system.

6. The method of claim 1 wherein the predetermined range of temperatures is a range of temperatures within which the laser diode has a user-defined power versus performance ratio.

7. The method of claim 1 wherein the predetermined range of temperatures are input by one of a user and a system generated source.

8. The method of claim 1 wherein the predetermined range of temperatures is determined by a user setting a temperature measure above and below a fixed temperature that corresponds to a wavelength of light output from the laser diode.

9. An apparatus comprising:

means for operating a thermo-electric cooler coupled to a laser diode in one of a low power mode and a standard mode; and means for switching between the low power mode and the standard mode, wherein the low power mode maintains the laser diode at a first temperature within a predetermined range of temperatures by operating the thermo-electric cooler according to a non-linear transfer function and the standard mode maintains the laser diode at a second temperature that corresponds to a predetermined wavelength of light output from the laser diode by operating the thermo-electric cooler according to a non-linear transfer function.

10. The apparatus of claim 9 wherein the predetermined range of temperatures is determined by a user setting a temperature measure above and below a fixed temperature that corresponds to a wavelength of light output from the laser diode.

11. The apparatus of claim 9 wherein the low power mode is a Time Division Multiplexing (TDM) mode.

12. The apparatus of claim 9 wherein the standard mode is a Dense Wavelength Divison Multipexing (DWDM) mode.

13. The apparatus of claim 9 wherein laser diode is configured in an OC-192 transceiver line card disposed in a synchronous optical network (SONET) communication system.

14. An optical transceiver comprising:

a temperature circuit;

a thermo-electric cooler coupled to the temperature circuit; and a laser diode coupled to the thermo-electric cooler, wherein the thermo-electric cooler is responsive to inputs from the temperature circuit, the inputs identifying one of at least a first mode and a second mode, wherein a choice of the one of at least a first mode and a second mode is a function of a performance requirement, and wherein the first mode corresponds to operating the thermo-electric cooler according to a non-linear transfer function, and the second mode corresponds to operating the thermo-electric cooler according to a linear transfer function.

15. The optical transceiver of claim 14 wherein the performance requirement is one of the first mode, wherein the first mode is a standard mode for dense wavelength division multiplexing (DWDM) applications, and the second mode, wherein the second mode is a low-power mode for time domain multiplexing (TDM) applications.

16. The optical transceiver of claim 14, further comprising:

a temperature circuit, the temperature circuit including a switch configured to alter the thermo-electric cooler between the first mode and the second mode.

17. The optical transceiver of claim 14 wherein the second mode is a dense wavelength division multiplexing (DWDM) mode and the first mode is a time-division multiplexed (TDM) mode.

18. The optical transceiver of claim 14 further comprising:

a coupler coupled to the laser diode, the lens producing an optical signal; and an optical fiber coupled to the coupler; and a wavelength signal circuit coupled to the coupler and the temperature circuit, the wavelength signal circuit configured to transmit feedback to the temperature circuit to maintain a stable wavelength of the laser diode.

19. The optical transceiver of claim 14 wherein the optical transceiver is disposed on an OC-192 transceiver line card of a synchronous optical network (SONET) communication system.

20. The optical transceiver of claim 14 wherein the first mode is a low-power mode and the second mode is a standard mode, the first mode configured to permit a predetermined amount of wavelength drift.

21. The optical transceiver of claim 14 wherein the first mode is a low-power mode in which the thermo-electric cooler dissipates less than 5 Watts under normal operating conditions.

22. The optical transceiver of claim 14 wherein the low power mode permits wavelength drift within operable parameters.

* * * * *